(12) United States Patent
Liu et al.

(10) Patent No.: US 10,978,525 B2
(45) Date of Patent: Apr. 13, 2021

(54) ORGANIC LIGHT EMITTING DEVICE, DISPLAY AND MOBILE COMMUNICATION DEVICE

(71) Applicant: KunShan Go-Visionox Opto-Electronics Co., Ltd., Jiangsu (CN)

(72) Inventors: Quan Liu, Jiangsu (CN); Lu Zhang, Jiangsu (CN); Siming Hu, Jiangsu (CN); Zhenzhen Han, Jiangsu (CN)

(73) Assignee: KunShan Go-Visionox Opto-Electronics Co., Ltd., Jiangsu (CN)

( * ) Notice: Subject to any disclaimer, the term of this patent is extended or adjusted under 35 U.S.C. 154(b) by 0 days.

(21) Appl. No.: 16/322,271

(22) PCT Filed: Jun. 7, 2018

(86) PCT No.: PCT/CN2018/090275
§ 371 (c)(1),
(2) Date: Jan. 31, 2019

(87) PCT Pub. No.: WO2019/085478
PCT Pub. Date: May 9, 2019

(65) Prior Publication Data
US 2020/0286969 A1 Sep. 10, 2020

(30) Foreign Application Priority Data
Oct. 31, 2017 (CN) .......................... 201711053191.8

(51) Int. Cl.
*H01L 27/32* (2006.01)
*H01L 51/52* (2006.01)

(52) U.S. Cl.
CPC ...... *H01L 27/3246* (2013.01); *H01L 27/3283* (2013.01); *H01L 51/5203* (2013.01)

(58) Field of Classification Search
CPC .................... H01L 27/3246; H01L 51/5203
See application file for complete search history.

(56) References Cited

U.S. PATENT DOCUMENTS 9,600,127 B2 3/2017 Hong
2005/0248929 A1* 11/2005 Kawamura ......... H01L 51/5281
362/84

(Continued)

FOREIGN PATENT DOCUMENTS

CN 102106186 A 6/2011
CN 102655131 A 9/2012

(Continued)

*Primary Examiner* — Jay C Chang
*Assistant Examiner* — Mikka Liu
(74) *Attorney, Agent, or Firm* — Baker & Hostetler LLP

(57) ABSTRACT

An organic light emitting device having an overlapped area located at an edge of a non-display area. The organic light emitting device includes: a first electrode, a pixel definition layer, an isolation layer and a second electrode. The first electrode is arranged on a planarization layer of the overlapped area. The pixel definition layer is arranged on the first electrode, and further includes a number of pixel definition blocks. The isolation layer is arranged on the pixel definition layer, and further includes a number of supporting blocks arranged in a manner same to that of the number of pixel definition blocks of the pixel definition layer. The second electrode covers the first electrode, the pixel definition blocks, and the supporting blocks in the overlapped area. the second electrode overlaps the first electrode.

14 Claims, 2 Drawing Sheets

(56) References Cited

U.S. PATENT DOCUMENTS

| | | | |
|---|---|---|---|
| 2006/0001366 A1* | 1/2006 | Chung | H01L 27/3276 |
| | | | 313/506 |
| 2010/0051958 A1 | 3/2010 | Izumida et al. | |
| 2012/0092313 A1 | 4/2012 | Choi | |
| 2014/0353606 A1 | 12/2014 | Choi et al. | |
| 2015/0138146 A1 | 5/2015 | Hong | |
| 2015/0380467 A1 | 12/2015 | Su | |
| 2016/0035813 A1 | 2/2016 | Lee et al. | |
| 2016/0307971 A1 | 10/2016 | Jeon | |
| 2017/0084674 A1* | 3/2017 | Song | H01L 51/0004 |
| 2018/0151850 A1* | 5/2018 | Lee | H01L 27/3206 |

FOREIGN PATENT DOCUMENTS

| | | |
|---|---|---|
| CN | 103258968 A | 8/2013 |
| CN | 104103663 A | 10/2014 |
| CN | 104485350 A | 4/2015 |
| CN | 104766930 A | 7/2015 |
| CN | 104934461 A | 9/2015 |
| CN | 204809228 U | 11/2015 |
| CN | 105428548 A | 3/2016 |
| CN | 206194793 U | 5/2017 |
| CN | 107046105 A | 8/2017 |
| CN | 107104127 A | 8/2017 |
| CN | 107302016 A | 10/2017 |
| JP | 2011232482 A | 11/2011 |
| TW | 365005 B | 7/1999 |
| TW | 201203648 A | 1/2012 |

\* cited by examiner

ORGANIC LIGHT EMITTING DEVICE, DISPLAY AND MOBILE COMMUNICATION DEVICE

CROSS-REFERENCE TO RELATED APPLICATIONS

This application is a National Stage of International patent application PCT/CN2018/090275, filed on Jun. 7, 2018, which claims priority to foreign Chinese patent application No. CN 201711053191.8, filed on Oct. 31, 2017, the disclosures of which are incorporated by reference in their entirety.

TECHNICAL FIELD

The application relates to a field of an organic light emitting device, and in particular to an improvement of a layout of an overlapped area of an organic light emitting device.

BACKGROUND

For an existing display device, an Organic Light Emitting Diode (OLED for short), as a current-type light emitting device, is increasingly used in a field of high-performance display for its characteristics such as self-luminance, fast response, wide viewing angle, fabrication on a flexible substrate.

With an extension of OLED used in the field of display, requirements for a brightness of OLED display screen body are increasing accordingly. However, in areas where displays and wires are overlapped, owing to ignorance of an influence of a disordered layout, a problem of uneven brightness of the display occurs because of an aperture ratio of the overlapped area affected by the disordered or inconsistent layout of the overlapped area under a requirement of a high-resolution screen body.

SUMMARY

In view of above, a technical problem to be solved by the application is insufficient aperture ratio of the organic light emitting device in a cathode overlapped area, resulting in uneven brightness of the screen body. The application provides an organic light emitting device, a display and a mobile communication apparatus applied thereto.

The above object of the application can be achieved by the following technical solutions:
An organic light emitting device having an overlapped area located at an edge of a non-display area, comprising:
a first electrode arranged on a planarization layer of the overlapped area;
a pixel definition layer arranged on the first electrode, the pixel definition layer further comprising a plurality of pixel definition blocks;
an isolation layer arranged on the pixel definition layer and further comprising a plurality of supporting blocks respectively located on the plurality of pixel definition blocks;
a second electrode covering the first electrode, the plurality of pixel definition blocks, and the plurality of supporting blocks in the overlapped area, the second electrode overlapping the first electrode.
Wherein, in the overlapped area, vertical projection positions of the plurality of supporting blocks of the isolation layer are same to vertical projection positions of the plurality of the pixel definition blocks of the pixel definition layer.

Wherein, an area of any one of the plurality of pixel definition blocks is larger than an area of a corresponding supporting block thereof.

Wherein, the first electrode of the organic light emitting device of the application further comprises, in the overlapped area, a plurality of openings arranged in a manner same to that of the plurality of pixel definition blocks of the pixel definition layer.

Wherein, in the overlapped area, vertical projection positions of the plurality of openings of the first electrode are same to vertical projection positions of the plurality of pixel definition blocks of the pixel definition layer.

Wherein, the plurality of pixel definition blocks of the plurality of pixel definition layer fill in and cover the plurality of openings of the first electrode.

Wherein, the first electrode and the second electrode are transparent electrodes.

Wherein, the plurality of pixel definition blocks and the plurality of supporting blocks are both made from organic materials.

The application also provides an organic light emitting display comprising a flexible printed circuit board (FPC) and a power supply interface, and the organic light emitting display uses the above-mentioned organic light emitting device.

The application also provides a mobile communication apparatus comprising a communication device and a display, the display being the above-mentioned organic light emitting display.

Compared with the prior art, the organic light emitting device of the application, via the same arrangement manner or the same vertical projection position of the supporting blocks and the pixel definition blocks, can reduce shielding of the cathode overlapped area, increase a aperture ratio of the cathode overlapped area, and reduce a voltage drop of Vss wires, thereby improving a problem of uneven brightness of a screen body.

The organic light emitting device of the application, via the same arrangement manner or the same vertical projection position of the supporting blocks and the openings, can reduce the shielding of the cathode overlapped area, increase the aperture ratio of the cathode overlapped area, and reduce the voltage drop of the Vss wires, thereby improving the problem of uneven brightness of the screen body.

The organic light emitting device of the application enables, via a stack manner in the application, a thickness from a bottom end of a substrate to the supporting block is the same or close whether in the overlapped area or in the display area, which is advantageous for enhancing an impact resistance ability of the screen body of the organic light emitting device.

Of course, any product implementing the application does not necessarily require achieving all of the technical effects mentioned above at the same time.

DETAILED DESCRIPTION

The embodiments of the application will be described in detail below with reference to the accompanying drawings and embodiments, so that implementation process of the application on how the technical problems can be solved by the technical solution and how to achieve the technical effect will be fully understood and implemented accordingly.

Figure 1:
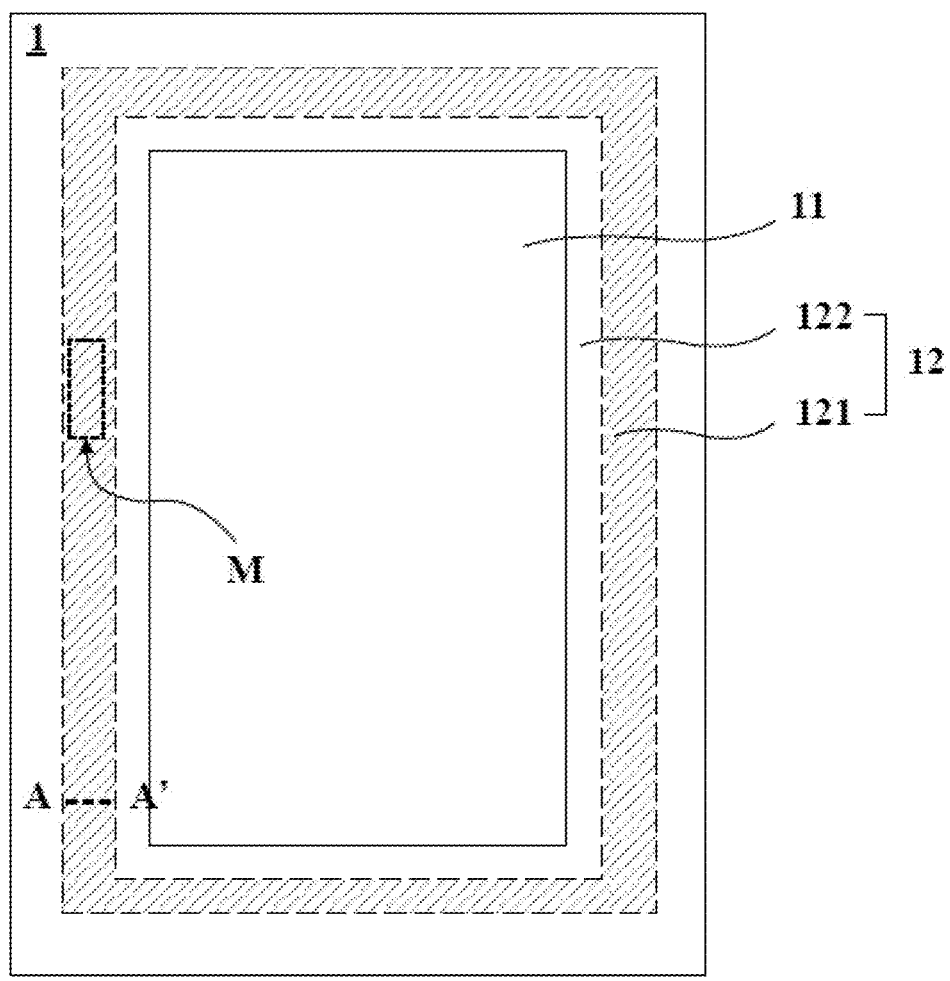
FIG. 1 is a schematic structural view of an organic light emitting device according to an embodiment of the application.

FIG. 1 is a schematic structural view of an organic light emitting device according to an embodiment of the application. As shown in FIG. 1, a substrate 1 includes a display area 11 and a non-display area 12. The display area 11 is arranged on a substrate 1, and the non-display area 12 is arranged in an area on the substrate 1 outside the display area 11. The non-display area 12 also includes an overlapped area 121 and a drive circuit area 122. The overlapped area 121 is located at the edge of the non-display area 12, and the drive circuit area 122 is located between the overlapped area 121 and the display area 11. In this embodiment, the overlapped area 121 is a cathode overlapped area, but the application is not limited thereto.

Figure 2:
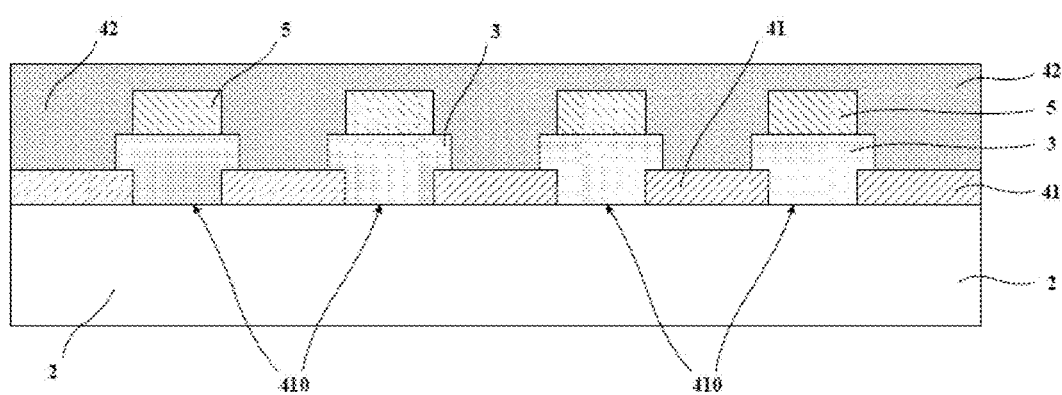
FIG. 2 is a cross-sectional view taken along a line A-A' of a structure of the organic light emitting device according to an embodiment of the application.

FIG. 2 is a cross-sectional view taken along a line A-A' of the structure of the organic light emitting device according to an embodiment of the application; The cross-sectional view taken along the line A-A' shown in FIG. 2 is a cross-sectional view of the overlapped area 121 of the non-display area 12 of FIG. 1. As shown in FIG. 2, the overlapped area 121 of the organic light emitting device of the application further includes a planarization layer 2, a pixel definition layer, a first electrode 41, a second electrode 42, and an isolation layer. The planarization layer 2 is arranged on the substrate 1, and the first electrode 41 is arranged on the planarization layer 2 of the overlapped area. The pixel definition layer is arranged on the first electrode 41, and further includes a plurality of pixel definition blocks 3. The isolation layer is arranged on the pixel definition layer, and the isolation layer further includes a plurality of supporting blocks 5. The second electrode 42 covers the first electrode 41, the plurality of pixel definition blocks 3, and the plurality of supporting blocks 5 in the overlapped area 121. The second electrode 42 overlaps the first electrode 41. In this embodiment, the first electrode 41 may be an anode layer in an organic light emitting device during a manufacturing process, and the second electrode 42 may be a cathode layer in the organic light emitting device during the manufacturing process. The second electrode 42 is connected to the first electrode 41 by the way of overlaying (also called overlapped). In this embodiment, the first electrode 41 and the second electrode 42 are transparent electrodes, and the second electrode 42 may also have an integrated structure. In this embodiment, the plurality of pixel definition blocks 3 and the plurality of supporting blocks 5 may both be made from organic materials, but the application is not limited thereto.

The embodiment disclosed in FIG. 2, by way of example, will be described in detail. In the overlapped area 121, the arrangement manner of the plurality of supporting blocks 5 of the isolation layer is same to that of the plurality of the pixel definition blocks 3 of the pixel definition layer. The vertical projection positions of the plurality of supporting blocks 5 of the isolation layer are same to the vertical projection positions of the plurality of pixel definition blocks 3 of the pixel definition layer. In this embodiment, in the overlapped area 121, the area of the plurality of pixel definition blocks 3 of the pixel definition layer may be larger than that of the plurality of supporting blocks 5 of the isolation layer, but the application is not limited thereto.

As shown in FIG. 2, the first electrode 41 further includes a plurality of openings 410 in the overlapped area 121. The plurality of openings 410 may be cylindrical, square cylindrical or tapered, but the application is not limited thereto. The arrangement manner of the plurality of openings 410 is same to the arrangement manner of the plurality of pixel definition blocks 3 of the pixel definition layer. In the overlapped area 121, the vertical projection positions of the plurality of openings 410 of the first electrode 41 are same to the vertical projection positions of the plurality of pixel definition blocks 3 of the pixel definition layer. In this embodiment, the pixel definition block 3 of the pixel definition layer may further fill in and cover a plurality of openings 410 of the first electrode 41.

Figure 3:
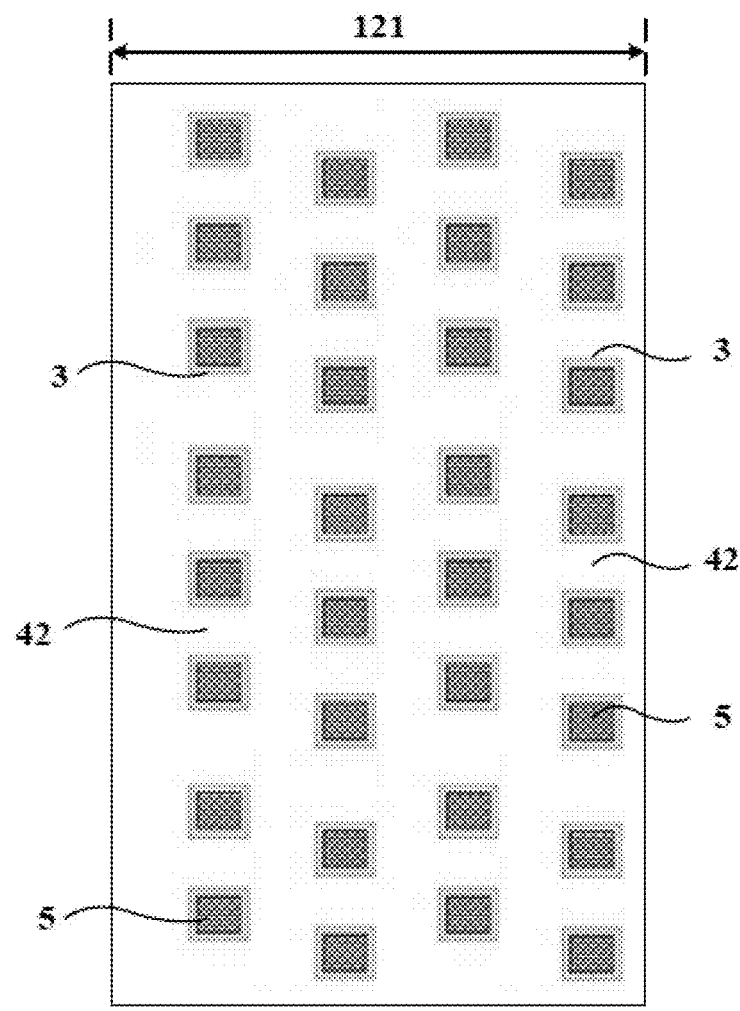
FIG. 3 is an enlarged schematic view showing an overlapped area of the structure of the organic light emitting device according to an embodiment of the application.

FIG. 3 is an enlarged schematic view showing an overlapped area of the structure of the organic light emitting device according to an embodiment of the application. A partial enlarged view shown in FIG. 3 is a schematic layout top view of an M area in the overlapped area 121 of the non-display area of FIG. 1. As shown in FIG. 3, a plurality of supporting blocks 5 overlap with the pixel definition blocks 3, and in the layout top view, a plurality of openings 410 not shown actually overlap with a plurality of pixel definition blocks 3 of the pixel definition layer. It can be understood with reference to the cross-sectional view of FIG. 2, the vertical projection positions of the plurality of pixel definition blocks 3 of the pixel definition layer are same to the vertical projection positions of the plurality of openings 410 of the first electrode 41, and the vertical projection positions of the plurality of supporting blocks 5 of the isolation layer are further same to the vertical projection position of the plurality of pixel definition blocks 3 of the pixel definition layer, thus it can be understood that the vertical projection positions of the pixel definition blocks 3, the openings 410, and the supporting blocks 5 can all be the same.

Continuing to refer to FIG. 3, the plurality of supporting blocks 5 and the plurality of pixel definition blocks 3 are arranged with a spacing, and the spacing distance may be equidistant, equidifferently increased, or equidifferently decreased. Thus, the arrangement manner of the plurality of supporting blocks 5 of the isolation layer is same to the arrangement manner of the plurality of pixel definition blocks 3 of the pixel definition layer. An area of the pixel definition blocks 3 may be greater than or equal to an area of the supporting blocks 5, and can be adaptively adjusted according to actual design requirements. In the illustration of the embodiment, the area of the pixel definition block 3 is larger than the area of the supporting block 5, however, the application is not limited thereto. In another embodiment of the application, the arrangement manner of the pixel definition blocks 3 and the supporting blocks 5 in the overlapped area 121 is same to the arrangement manner of the pixel definition blocks 3 and the supporting blocks 5 in the display area 11. The organic light emitting device of the application enables, via the stack manner in the application, a thickness from a bottom end of the substrate 1 to the supporting block 5 is the same or close whether in the overlapped area 121 or in the display area 11, which is advantageous for enhancing the impact resistance ability of the screen body of the organic light emitting device. The organic light emitting device can perform the quality test on impact resistance of the screen body through a drop ball test for quality inspection. The pass rate of the drop ball test of the organic light emitting device in the embodiment of the application is significantly higher than that in the prior art, which is sufficient to confirm that the organic light emitting device of the embodiment of the application can effectively improve the impact resistance of the screen body. The organic light emitting device of the application, via the same arrangement manner or the same vertical projection position of the pixel definition blocks 3, the supporting blocks 5 and the openings 410, can reduce the shielding of the cathode overlapped area, increase the aperture ratio of the cathode overlapped area, and reduce the voltage drop of the Vss wires, thereby improving the problem of uneven brightness of the screen body.

On this basis, the application further provides an organic light emitting display which uses the aforementioned organic light emitting device, including a flexible printed circuit board (FPC) and a power supply interface. Meanwhile, a mobile communication apparatus is provided including a communication device and a display which is the aforementioned organic light emitting display.

What is claimed is:

1. An organic light emitting device having an overlapped area located at an edge of a non-display area, comprising:
   a first electrode arranged on a planarization layer of the overlapped area and further comprising, in the overlapped area, a plurality of openings;
   a pixel definition layer arranged on the first electrode and further comprising a plurality of pixel definition blocks;
   an isolation layer arranged on the pixel definition layer and further comprising a plurality of supporting blocks respectively located on the plurality of pixel definition blocks;
   a second electrode covering the first electrode, the plurality of pixel definition blocks, and the plurality of supporting blocks in the overlapped area, the second electrode overlapping the first electrode,
   wherein in the overlapped area, an arrangement manner of the plurality of openings of the first electrode is same as that of the plurality of pixel definition blocks of the pixel definition layer.

2. The organic light emitting device according to claim 1, wherein in the overlapped area, an arrangement manner of the plurality of supporting blocks of the isolation layer is same as that of the plurality of pixel definition blocks of the pixel definition layer.

3. The organic light emitting device according to claim 2, wherein in the overlapped area, vertical projection positions of the plurality of supporting blocks of the isolation layer are same as vertical projection positions of the plurality of pixel definition blocks of the pixel definition layer.

4. The organic light emitting device according to claim 3, wherein in the overlapped area, an area of any one of the plurality of pixel definition blocks is larger than an area of a corresponding supporting block thereof.

5. The organic light emitting device according to claim 1, wherein in the overlapped area, vertical projection positions of the plurality of openings of the first electrode are same as vertical projection positions of the plurality of pixel definition blocks of the pixel definition layer.

6. The organic light emitting device of claim 1, wherein vertical projection positions, of the plurality of pixel definition blocks of the pixel definition layer, of the plurality of openings of the first electrode, and of the plurality of supporting blocks of the isolation layer are same.

7. The organic light emitting device according to claim 1, wherein the plurality of pixel definition blocks of the pixel definition layer fill in and cover the plurality of openings of the first electrode.

8. The organic light emitting device according to claim 1, wherein the first electrode and the second electrode are transparent electrodes.

9. The organic light emitting device according to claim 1, wherein the first electrode is an anode layer and the second electrode is a cathode layer.

10. The organic light emitting device according to claim 1, wherein the second electrode is an integrated structure.

11. The organic light emitting device according to claim 1, wherein the plurality of pixel definition blocks and the plurality of supporting blocks are both made from organic materials.

12. The organic light emitting device according to claim 1, wherein the pixel definition blocks and the supporting blocks located in the overlapped area of the organic light emitting device are arranged in a manner same as that of the pixel definition blocks and the supporting blocks located in a display area of the organic light emitting device.

13. An organic light emitting display, comprising a flexible printed circuit board and a power supply interface, and further comprises an organic light emitting device having an overlapped area located at an edge of a non-display area, the organic light emitting device comprising:
    a first electrode arranged on a planarization layer of the overlapped area and further comprising, in the overlapped area, a plurality of openings;
    a pixel definition layer arranged on the first electrode and further comprising a plurality of pixel definition blocks;
    an isolation layer arranged on the pixel definition layer and further comprising a plurality of supporting blocks respectively located on the plurality of pixel definition blocks;
    a second electrode covering the first electrode, the plurality of pixel definition blocks, and the plurality of supporting blocks in the overlapped area, the second electrode overlapping the first electrode,
    wherein in the overlapped area, an arrangement manner of the plurality of openings of the first electrode is same as that of the plurality of pixel definition blocks of the pixel definition layer.

14. A mobile communication apparatus comprises a communication device and a display, the display being the organic light emitting display of claim 13.

\* \* \* \* \*